US009207272B2

United States Patent
Oh et al.

(10) Patent No.: US 9,207,272 B2
(45) Date of Patent: Dec. 8, 2015

(54) TEST HANDLER THAT RAPIDLY TRANSFORMS TEMPERATURE AND METHOD OF TESTING SEMICONDUCTOR DEVICE USING THE SAME

(71) Applicant: Samsung Electronics Co., Ltd, Suwon-si, Gyeonggi-do (KR)

(72) Inventors: Jea-Muk Oh, Asan-si (KR); Sangil Kim, Asan-si (KR); Byoungjun Min, Asan-si (KR); Jongpil Park, Asan-si (KR)

(73) Assignee: Samsung Eletronics Co., Ltd., Suwon-si (KR)

( * ) Notice: Subject to any disclaimer, the term of this patent is extended or adjusted under 35 U.S.C. 154(b) by 169 days.

(21) Appl. No.: 14/026,168

(22) Filed: Sep. 13, 2013

(65) Prior Publication Data

US 2014/0077829 A1 Mar. 20, 2014

(30) Foreign Application Priority Data

Sep. 17, 2012 (KR) ........................ 10-2012-0103015

(51) Int. Cl.
*G01R 31/26* (2014.01)
*G01R 31/28* (2006.01)

(52) U.S. Cl.
CPC ........ *G01R 31/2601* (2013.01); *G01R 31/2865* (2013.01); *G01R 31/2874* (2013.01)

(58) Field of Classification Search
USPC ........................ 324/750.03, 750.07, 750.09
See application file for complete search history.

(56) References Cited

U.S. PATENT DOCUMENTS

| | | | | |
|---|---|---|---|---|
| 4,341,432 A | * | 7/1982 | Cutchaw | H01L 23/4006 165/80.4 |
| 4,781,494 A | * | 11/1988 | Cedrone | H01L 21/67784 209/573 |
| 4,845,426 A | * | 7/1989 | Nolan | G01R 31/2874 324/750.03 |
| 4,869,636 A | * | 9/1989 | Reid | G01R 31/2893 414/287 |
| 5,227,717 A | * | 7/1993 | Tsurishima | G01R 1/04 324/754.11 |
| 5,537,051 A | * | 7/1996 | Jalloul | G01R 1/0735 324/750.25 |
| 5,650,732 A | * | 7/1997 | Sakai | G01R 1/06705 324/757.04 |
| 5,788,084 A | * | 8/1998 | Onishi | G01R 31/04 209/573 |

(Continued)

FOREIGN PATENT DOCUMENTS

JP 05-034405 2/1993
JP 2003-028918 1/2003

(Continued)

*Primary Examiner* — Jermele M Hollington
*Assistant Examiner* — Suresh K Rajaputra
(74) *Attorney, Agent, or Firm* — EIPG, PLLC

(57) ABSTRACT

A test handler and a test method of a semiconductor device using the same includes a plurality of chambers to provide a sealed inner space accommodating a first tray on which semiconductor devices are mounted, a test module electrically connected to the semiconductor devices in the chambers to perform a test process of the semiconductor devices, and a sort part to load and unload the first tray in the chambers and to sort semiconductor devices determined to be failed in the test process. The plurality of chambers have a fluid path circulating a coolant or a heat medium in the walls so that a temperature of the plurality of chambers is rapidly changed at the test process of the semiconductor devices between a first temperature that is less than room temperature and a second temperature that is greater than room temperature.

17 Claims, 14 Drawing Sheets

(56) References Cited

U.S. PATENT DOCUMENTS

| | | | | |
|---|---|---|---|---|
| 5,847,293 A * | 12/1998 | Jones | G01R 31/2851 | 324/750.08 |
| 5,958,140 A * | 9/1999 | Arami | C23C 16/45502 | 118/715 |
| 5,966,940 A * | 10/1999 | Gower | F25B 21/04 | 165/61 |
| 6,163,145 A * | 12/2000 | Yamada | G01R 1/06705 | 324/750.03 |
| 6,218,852 B1 * | 4/2001 | Smith | G01R 31/2806 | 324/757.02 |
| 6,313,649 B2 * | 11/2001 | Harwood | G01R 31/02 | 324/750.14 |
| 6,448,575 B1 * | 9/2002 | Slocum | H01L 23/34 | 257/48 |
| 6,717,115 B1 * | 4/2004 | Pfahnl | H01L 21/67103 | 118/724 |
| 6,723,964 B2 | 4/2004 | Hwang et al. | | |
| 6,861,861 B2 * | 3/2005 | Hwang | G01R 31/2877 | 324/750.08 |
| 6,972,557 B2 * | 12/2005 | Park | G01R 31/2893 | 324/750.08 |
| 7,049,841 B2 | 5/2006 | Yamashita | | |
| 7,129,731 B2 * | 10/2006 | Thayer | F25B 23/006 | 165/80.4 |
| 7,142,002 B1 * | 11/2006 | Clemons | G01R 31/2893 | 324/750.25 |
| 7,355,428 B2 | 4/2008 | Kabbani et al. | | |
| 7,408,338 B2 * | 8/2008 | Ham | G01R 31/2893 | 324/756.02 |
| 7,538,542 B2 | 5/2009 | Shim et al. | | |
| 7,554,349 B2 * | 6/2009 | Kang | G01R 31/2865 | 324/750.03 |
| 7,633,288 B2 * | 12/2009 | Chung | G01R 31/2893 | 324/762.01 |
| 7,726,145 B2 | 6/2010 | Nakamura | | |
| 7,804,316 B2 * | 9/2010 | Ito | G01R 31/2887 | 324/754.11 |
| 7,838,790 B2 * | 11/2010 | Kang | G01R 31/2893 | 209/573 |
| 2002/0109518 A1 | 8/2002 | Saito | G01R 1/0458 | 324/750.09 |
| 2003/0085160 A1 * | 5/2003 | Shim | G01R 31/2887 | 209/573 |
| 2004/0216536 A1 * | 11/2004 | Park | G01R 31/2893 | 73/865.6 |
| 2004/0259402 A1 * | 12/2004 | Lee | G01R 31/2893 | 439/173 |
| 2005/0012498 A1 * | 1/2005 | Lee | G01R 31/2893 | 324/750.08 |
| 2006/0158179 A1 * | 7/2006 | Chyan | G01R 31/2893 | 324/750.25 |
| 2008/0290004 A1 * | 11/2008 | Tsai | G01R 31/2893 | 209/573 |
| 2009/0136118 A1 * | 5/2009 | Ichikawa | G01N 21/95607 | 382/145 |
| 2012/0062262 A1 * | 3/2012 | Lee | G01R 31/2893 | 324/757.04 |
| 2013/0206383 A1 * | 8/2013 | Maeda | F28F 27/00 | 165/253 |
| 2013/0257471 A1 * | 10/2013 | Lee | G01R 31/2808 | 324/757.02 |

FOREIGN PATENT DOCUMENTS

| | | |
|---|---|---|
| JP | 2003-028923 | 1/2003 |
| JP | 2003-194874 | 7/2003 |
| JP | 2004-347329 | 12/2004 |
| JP | 2006-343174 | 12/2006 |
| JP | 2007-003152 | 1/2007 |
| JP | 2007-071680 | 3/2007 |
| JP | 2007-071806 | 3/2007 |
| JP | 2009-103550 | 5/2009 |
| JP | 2009-103638 | 5/2009 |
| KR | 2002-0017267 | 3/2002 |
| KR | 10-0428031 | 5/2003 |
| KR | 10-0436657 | 6/2003 |
| KR | 10-0937930 | 2/2004 |
| KR | 10-0542126 | 11/2004 |
| KR | 2005-0031598 | 4/2005 |
| KR | 10-0813139 | 3/2007 |
| KR | 2007-0066421 | 6/2007 |
| KR | 10-0785741 | 11/2007 |
| KR | 2008-0096068 | 10/2008 |
| KR | 10-1209503 | 12/2012 |

* cited by examiner

TEST HANDLER THAT RAPIDLY TRANSFORMS TEMPERATURE AND METHOD OF TESTING SEMICONDUCTOR DEVICE USING THE SAME

CROSS-REFERENCE TO RELATED APPLICATIONS

This U.S. non-provisional patent application claims priority under 35 U.S.C. §119 of Korean Patent Application No. 10-2012-0103015, filed on Sep. 17, 2012, the entire contents of which are hereby incorporated by reference.

BACKGROUND

1. Field

The present inventive concept herein relates to semiconductor test facilities and methods of testing the same, and more particularly, to a test handler automatically performing an electrical test of semiconductor device and a method of testing a semiconductor device using the same.

2. Description of the Related Art

Recently, a capacity of a memory semiconductor device has rapidly increased. Additionally, the time that is consumed in an electrical test of a memory semiconductor device has steadily increased. Various studies to increase efficiency in an electrical test process are actively being performed.

A test handler among test facilities can test a plurality of semiconductor devices in a severe high temperature and low temperature environment. The semiconductor devices may be electrically tested by a test handler and a tester connected to the test handler. The tester is disposed outside the test handler and may test a plurality of semiconductor devices in the test handler in parallel. When the semiconductor devices are tested, the test handler may heat or cool the semiconductor devices by air. However, cooling air or heated air cannot change the temperatures of the semiconductor devices rapidly.

SUMMARY

Embodiments of the present general inventive concept provide a test handler. The test handler may include chambers that provide a sealed inner space that accommodates a first tray on which semiconductor devices are mounted, a test module electrically connected to the semiconductor devices in the chambers to perform a test process of the semiconductor devices, and a sort part to load and unload the first tray in the chambers and to sort semiconductor devices determined to fail in the test process. The chambers have a fluid path in which coolant or heat medium circulates in the walls so that a temperature of the chamber can be rapidly changed in the test process of the semiconductor devices between a first temperature that is less than room temperature and a second temperature that is greater than room temperature.

Additional features and utilities of the present general inventive concept will be set forth in part in the description which follows and, in part, will be obvious from the description, or may be learned by practice of the present general inventive concept.

Embodiments of the present general inventive concept also provide a method of testing a semiconductor device. The method may include the following operations. A plurality of first test trays may be sequentially loaded in a soak chamber and a test chamber. The soak chamber, the test chamber, an exit chamber and first semiconductor devices mounted on the plurality of first test trays may be cooled to a first temperature that is less than room temperature. The first semiconductor devices may be tested in the test chamber at a first temperature. The soak chamber, the test chamber, the exit chamber and the first semiconductor devices may be heated to a second temperature that is greater than room temperature. The first semiconductor devices may be tested in the test chamber at the second temperature. The first test trays may be transferred from the test chamber to the exit chamber, and discharged from an exit chamber to the outside. The second test trays may be sequentially loaded in the soak chamber and the test chamber. The second semiconductor devices in the second test tray may be tested in the test chamber at the second temperature. The soak chamber, the test chamber, the exit chamber and the second semiconductor devices may be cooled to the first temperature. The second semiconductor devices may be tested at the first temperature. The second test tray may be transferred from the test chamber to the exit chamber. The first test trays may be discharged from the exit chamber to the outside.

Exemplary embodiments of the present general inventive concept may include a test handler that has a stocker/loader to provide at least a first sealed inner space to load semiconductor devices, a tri-chamber processing unit to perform at least a first test process on the semiconductor devices when electrically connected to the semiconductor devices, an unloader/sort stocker to unload semiconductor devices and to sort semiconductor devices determined to be failed or approved in the at least first test process, and a controller to control a transfer of the semiconductor devices along a semiconductor manufacturing apparatus, wherein the tri-chamber processing unit has a fluid path to circulate coolant or a heat medium in walls thereof so that a temperature of at least a portion of the tri-chamber processing unit is changed rapidly at the test process of the semiconductor devices so as to provide at least one of a first temperature that is less than room temperature and a second temperature that is greater than room temperature.

The stocker/loader may include a stocker to load a plurality of semiconductor devices to a first tray and a loader to load semiconductor devices from the plurality of semiconductor devices mounted in the first tray into a second tray and to advance the second tray along the semiconductor manufacturing apparatus to a soak chamber.

The unloader/sort stocker may include an unloader to advance the second tray along the semiconductor manufacturing apparatus from an exit chamber and to unload semiconductors mounted in the second tray.

The unloader/sort stocker may include a sort part to sort semiconductors in accordance with whether the semiconductors are determined to be failed or approved in the at least first test process.

The tri-chamber processing unit may have a plurality of chambers that include a soak chamber to pre-heat or pre-cool the semiconductor devices before performing the at least first test process, a test chamber to perform an electrical test on the semiconductor devices, and an exit chamber to minimize temperature change of the test chamber during transfer of the semiconductor devices from the test chamber to the exit chamber.

BRIEF DESCRIPTION OF THE DRAWINGS

Preferred embodiments of the present general inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout. These and/or other features and utilities of the present general inventive concept will become apparent and more readily appreciated from the following description of the embodiments, taken in conjunction with the accompanying drawings of which.

DETAILED DESCRIPTION

Figure 1:
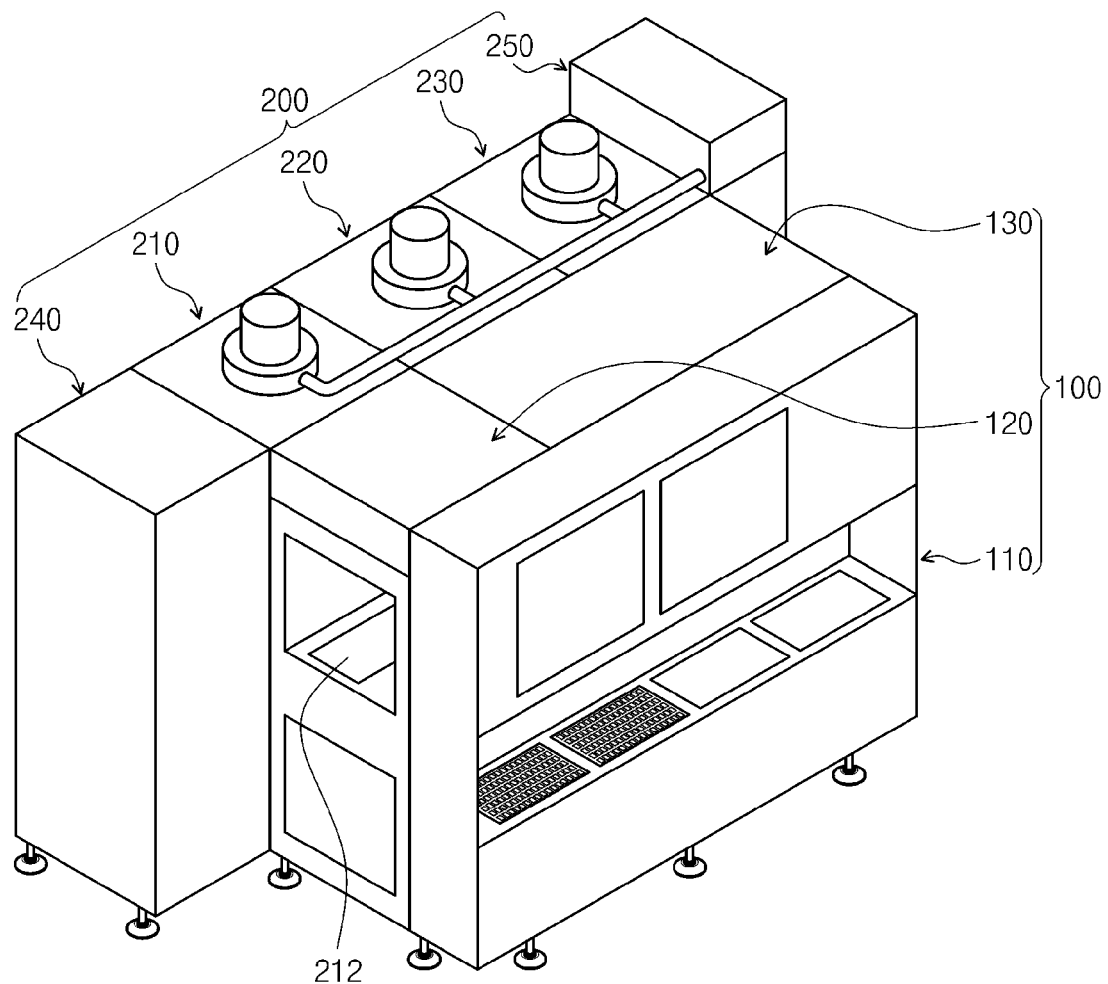
FIG. 1 is a perspective view illustrating a test handler in accordance with exemplary embodiments of the present general inventive concept.

Embodiments of the present general inventive concept will be described more fully hereinafter with reference to the accompanying drawings, in which exemplary embodiments of the present general inventive concept are shown. The present general inventive concept may, however, be embodied in many different forms and should not be construed as limited to the exemplary embodiments set forth herein. Rather, these exemplary embodiments are provided so that the description will be thorough and complete, and will fully convey the scope of the present general inventive concept to those skilled in the art. In the drawings, the size and relative sizes of layers and regions may be exaggerated for clarity. Like numbers refer to like elements throughout. Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 2:
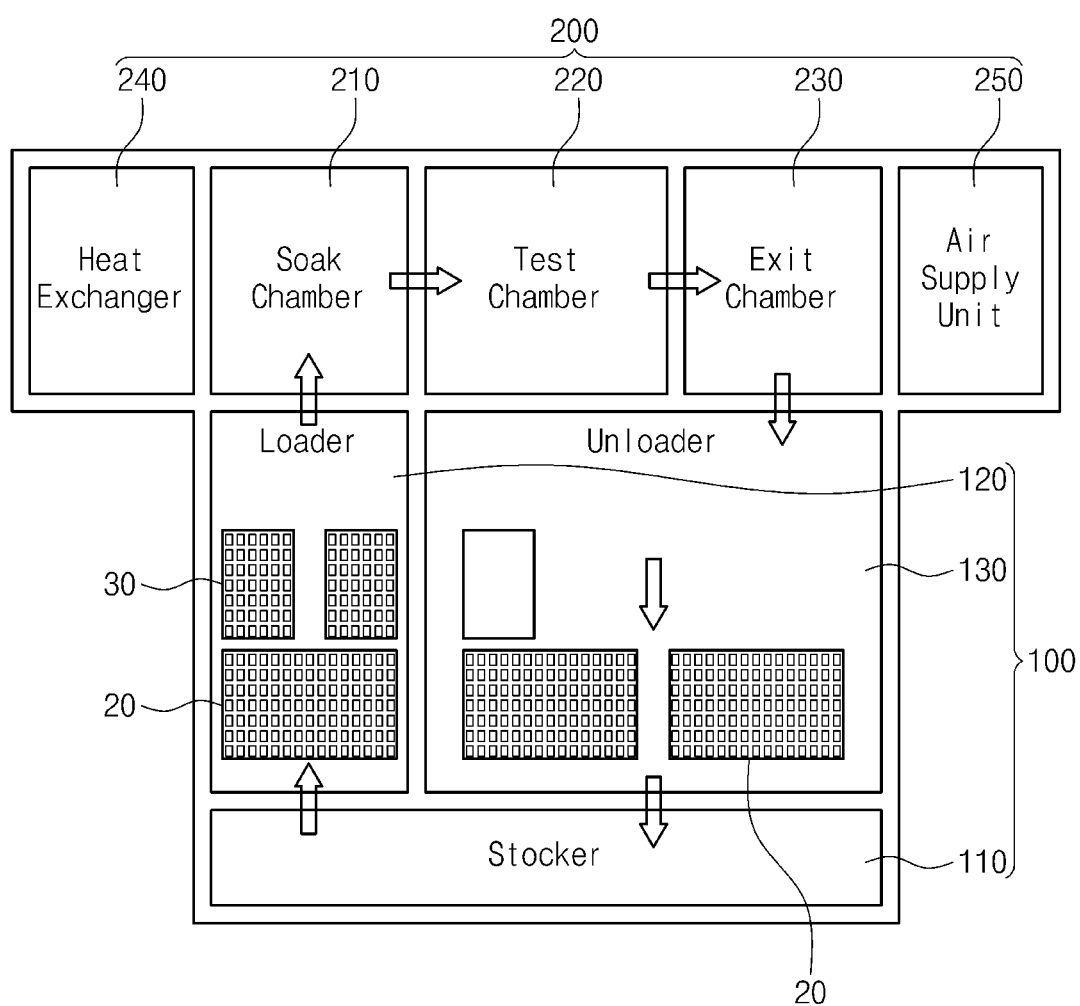
FIG. 2 is a top plan view illustrating exemplary embodiments of movement of semiconductor devices through various chambers of the test handler of FIG. 1 in accordance with the present general inventive concept.
Figure 3:
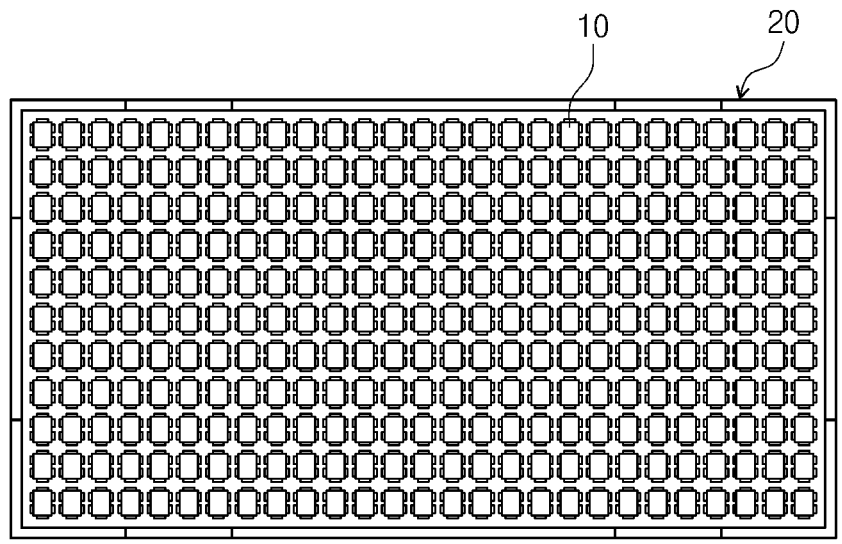
FIGS. 3 and 4 are top plan views illustrating exemplary embodiments of a carrier tray and a test tray, respectively, on which semiconductor devices are mounted in accordance with the present general inventive concept.
Figure 4:
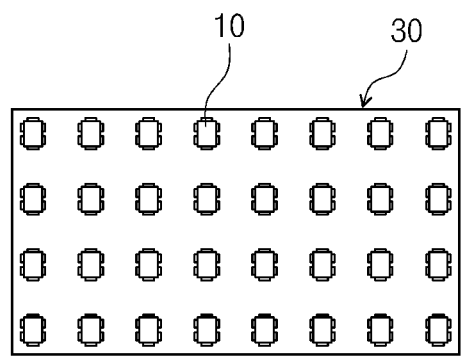

FIG. 1 is a perspective view illustrating a test handler in accordance with exemplary embodiments of the present general inventive concept. FIG. 2 is a top plan view illustrating movement of semiconductor devices 10 though various chambers in the test handler of FIG. 1 in accordance with the present general inventive concept. FIGS. 3 and 4 are top plan views illustrating exemplary embodiments of a carrier tray 20 and a test tray 30 on which semiconductor devices are mounted respectively in accordance with the present general inventive concept.

Referring to FIGS. 1 through 4, the test handler in accordance with exemplary embodiments of the present general inventive concept may be divided into a sort part 100 and a test part 200.

The sort part 100 delivers the semiconductor devices 10 to the test part 200 and may sort the semiconductor devices 10 tested in the test part 200 into approved semiconductor devices and failed semiconductor devices. The semiconductor devices 10 may be mounted on the carrier tray 20 in a semiconductor manufacturing apparatus (see FIG. 13) to be carried. The carrier tray 20 can mount about 250 or more semiconductor devices 10. The sort part 100 may include a stocker 110, a loader 120 and an unloader 130. The stocker 110 may temporarily store the carrier tray 20. The loader 120 may transfer the semiconductor devices 10 from the carrier tray 20 to the test tray 30. The test tray 30 may mount the semiconductor devices 10 at wider intervals as compared with the carrier tray 20. The carrier tray 20 may mount more semiconductor devices 10 as compared with the test tray 30. The test tray 30 may mount about 32 or more semiconductor devices 10. The test tray 30 may be moved to the test part 200 by the loader 120. The vacant carrier tray 20 moves from the loader 120 to the unloader 130 immediately. The unloader 130 may transfer the semiconductor devices 10 from the test tray 30 to the carrier tray 20. At this time, the semiconductor devices 10 may be sorted into approved semiconductor devices and failed semiconductor devices according to a result of tests performed in the test part 200.

The test part 200 may perform an electrical test on the semiconductor devices 10 at a temperature that is higher than room temperature and a temperature that is less than room temperature. The test part 200 may include a soak chamber 210, a test chamber 220, an exit chamber 230, a heat exchanger 240, an air supply unit 250 and a test module (260 of FIG. 11).

The soak chamber 210, the test chamber 220 and the exit chamber 230 may provide an internal space that is sealed from the outside. The soak chamber 210 can pre-heat or pre-cool the semiconductor devices 10 before performing a test. The test tray 30 may be vertically inserted into a door 212 of the soak chamber 210 in the loader 120. Alternatively, a robot arm or an elevator 1302 (see FIG. 13) may be disposed in the soak chamber 210 and the exit chamber 230. The robot arm 1302 (see FIG. 13) or the elevator may move the test tray 30 from the soak chamber 210 to the exit chamber 230 while maintaining a vertical state. The test chamber 220 may be connected to the soak chamber 210. The robot arm or the elevator 1302 (see FIG. 13) may move the test tray 30 from the soak chamber 210 to the test chamber 220. The semiconductor devices 10 may be tested by the test module 260 in the test chamber 220. The test module 260 will be described in detail in FIG. 11. The test chamber 220 may be connected to the exit chamber 230. The test tray 30 may be moved from the test chamber 220 to the exit chamber 230 by the robot arm or the elevator. The exit chamber 230 may minimize a temperature change of the test chamber 220.

The heat exchanger 240 and the air supply unit 250 may heat or cool the soak chamber 210, the test chamber 220 and the exit chamber 230 at the same time. The heat exchanger 240 may provide coolant or heat medium to the soak chamber 210, the test chamber 220 and the exit chamber 230. The air supply unit 250 may provide heated air or cooling air to the soak chamber 210, the test chamber 220 and the exit chamber 230. The heat exchanger 240 may be disposed to be adjacent to the soak chamber 210 and the air supply unit 250 may be disposed to be adjacent to the exit chamber 230. However, the present general inventive concept is not limited thereto. The heat exchanger 240 and the air supply unit 250 may have various shapes and may be variously disposed.

Figure 5:
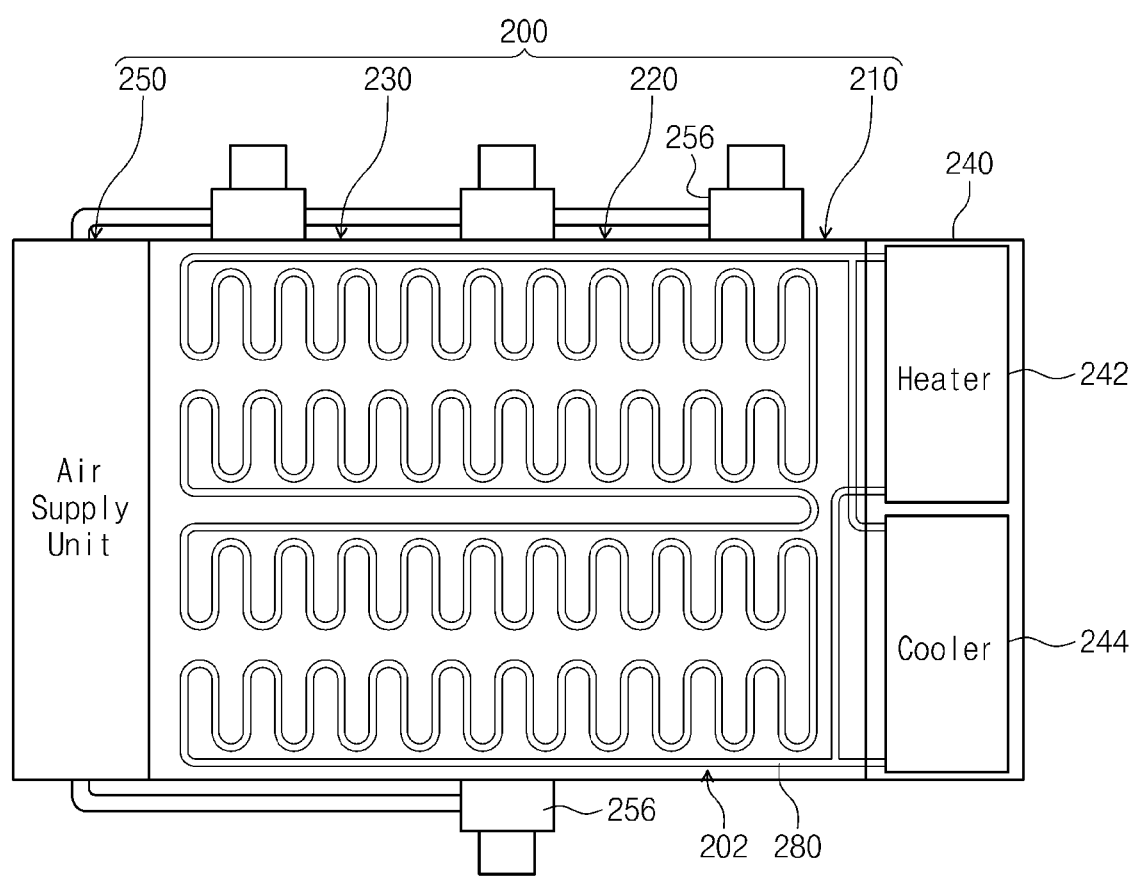
FIG. 5 is a drawing illustrating exemplary embodiments of fluid paths which exist in the walls of a soak chamber, a test chamber and an exit chamber in accordance with the present general inventive concept.
Figure 6:
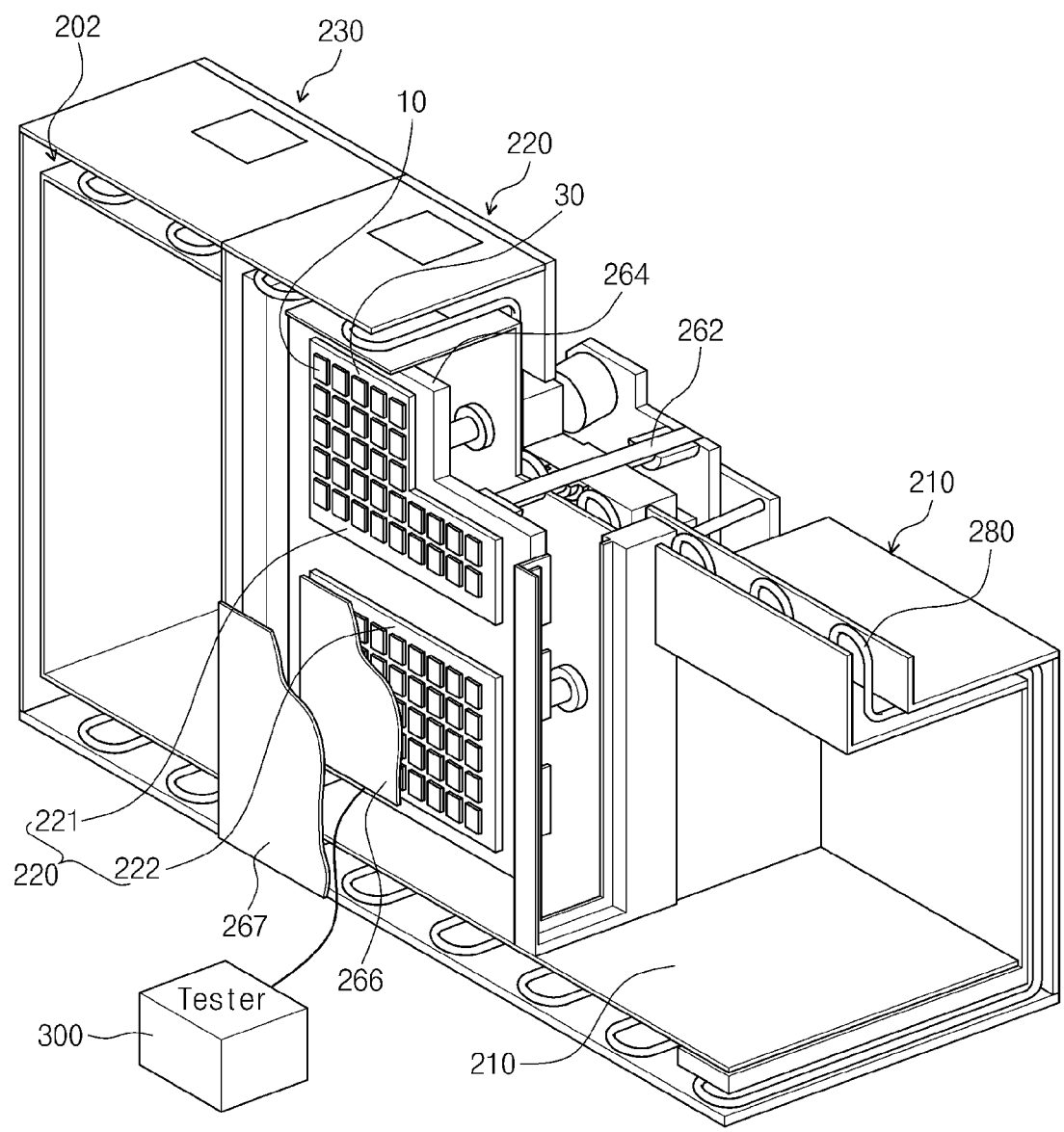
FIG. 6 is a perspective view illustrating exemplary embodiments of the inside of a soak chamber, a test chamber and an exit chamber in accordance with the present general inventive concept.

FIG. 5 illustrates and exemplary embodiment of fluid paths 280 which exist in the walls 202 of a soak chamber 210, a test chamber 220 and an exit chamber 230 in accordance with the present general inventive concept. FIG. 6 is a perspective view illustrating the inside of a soak chamber 210, a test chamber 220 and an exit chamber 230.

Referring to FIGS. 5 and 6, exemplary embodiments of the soak chamber 210, the test chamber 220 and the exit chamber 230 may have fluid paths circulating coolant or heat medium in the walls. The fluid path 280 may be connected to the heat exchanger 240. The heat exchanger 240 may include a heater 242 and a cooler 244. The heater 242 heats heat medium to circularly supply the heated medium to the fluid path 280 in the wall 202. The heat medium may include oil or alcohol. The cooler 244 may circularly cool the coolant in the fluid path 280. The coolant may include alcohol, antifreeze and nitrogen gas. Thus, the soak chamber 210, the test chamber 220 and the exit chamber 230 may be heated or cooled by heat medium or coolant in the fluid path 280. The test chamber 220 may include a first test chamber 221 and a second test chamber 222. A test process of the semiconductor devices 10 may be performed in the first test chamber 221 and the second test chamber 222. There is only a difference of the test process of the semiconductor devices 10 in the test tray 30 between the first test chamber 221 and the second test chamber 222, and there is not a difference of temperature. Because of this, as illustrated in FIG. 6, a partition wall may not exist between the first test chamber 221 and the second test chamber 222. Numerals 262, 264 and 266 refer to a load pusher, a contact drive plate and a test board respectively. The load pusher 262, the contact drive plate 264 and the test board 266 may be disposed in the first test chamber 221 and the second test chamber 222. The test board 266 may be electrically connected to a tester 300 outside the test chamber 220. A test process of the semiconductor devices 10 using the load pusher 262, the contact drive plate 264 and the test board 266 will be described in FIG. 11 again.

The soak chamber 210, the test chamber 220 and the exit chamber 230 may be heated or cooled by elevated temperature air and/or reduced temperature air. The air supply unit 250 may supply heated air and cooled air. Air blowers 256 blow heated air and cooled air in the soak chamber 210, the test chamber 220 and the exit chamber 230. The air blowers 256 may be connected to upper portions and/or lower portions of the soak chamber 210, the test chamber 220 and the exit chamber 230. The air supply unit 250 may change temperatures of the soak chamber 210, the test chamber 220 and the exit chamber 230 by convection of elevated temperature air and/or reduced temperature air.

Thus, the heat exchanger 240 and the air supply unit 250 may rapidly heat or cool the soak chamber 210, the test chamber 220 and the exit chamber 230.

Figure 7A:
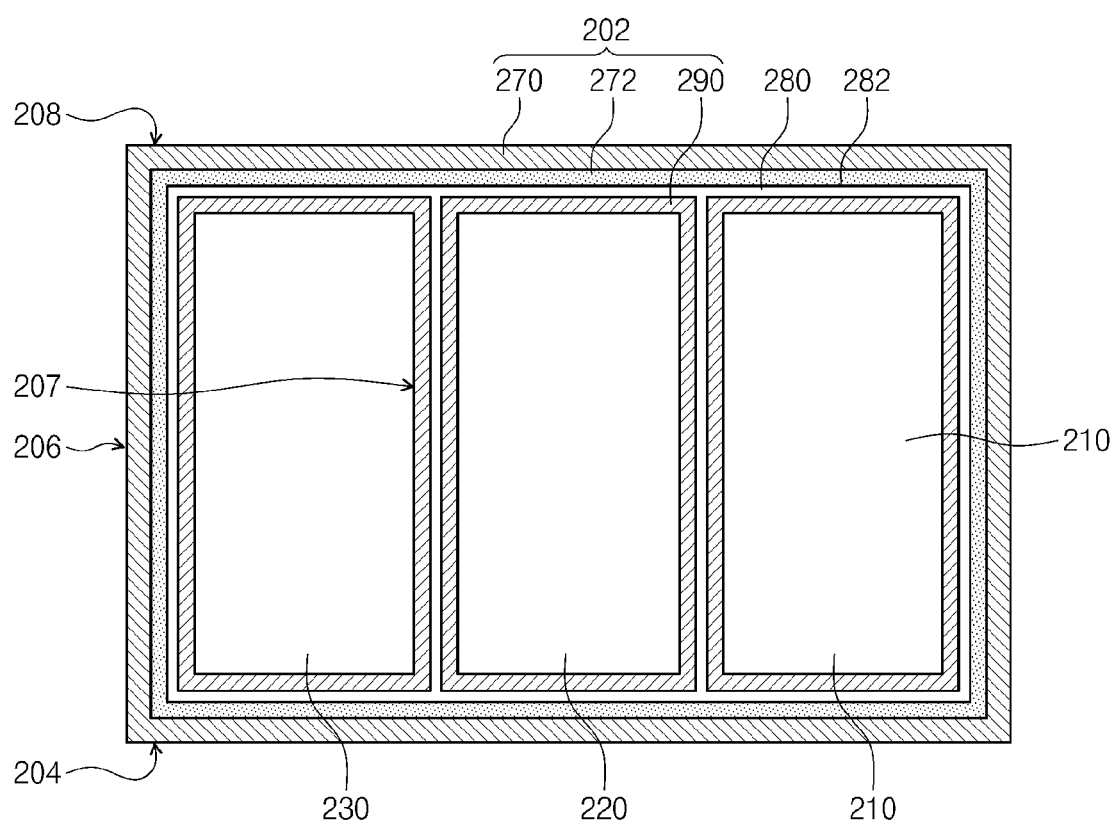
FIGS. 7A, 7B, and 8 illustrate exemplary embodiments of a soak chamber, a test chamber, an exit chamber and fluid paths disposed in walls thereof in accordance with the present general inventive concept.
Figure 7B:
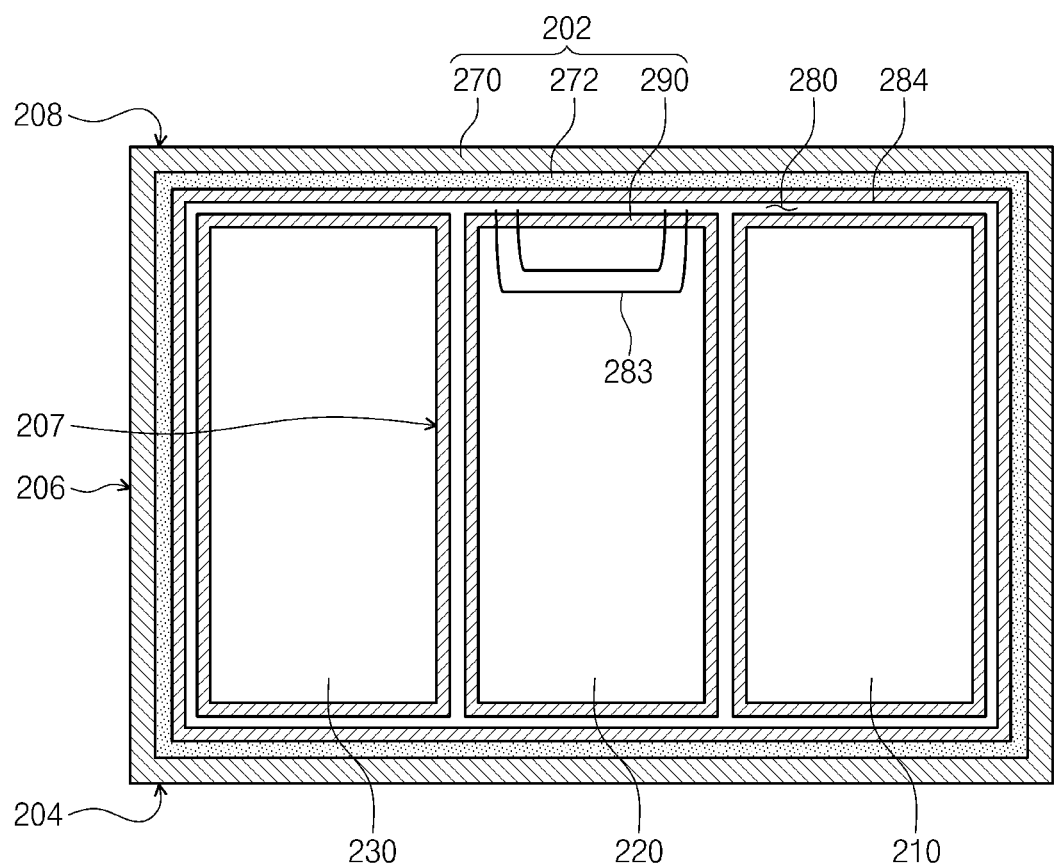
Figure 8:
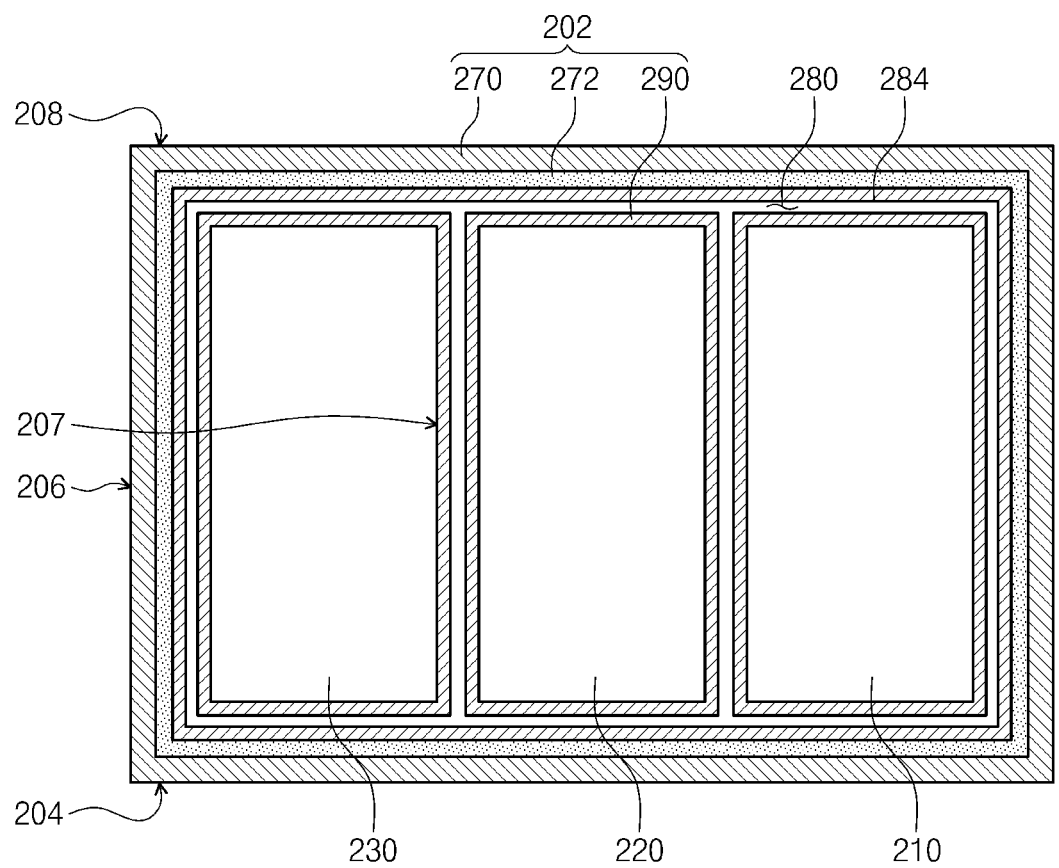

FIGS. 7A, 7B, and 8 illustrate exemplary embodiments of a soak chamber, a test chamber and an exit chamber and fluid paths disposed in walls thereof in accordance with the present general inventive concept.

Referring to FIGS. 7A, 7B, and 8, the wall 202 of the soak chamber 210, the test chamber 220 and the exit chamber 230 may include an outer wall housing 270, an insulating layer 272 and an inner wall housing 290. The outer wall housing 270 and the inner wall housing 290 may be made of stainless steel material. The insulating layer 272 may prevent heat conduction between the outer wall housing 270 and the inner wall housing 290. The insulating layer 272 may include glass fiber, asbestos, Styrofoam® or be a vacuum. The fluid path 280 may be disposed between the insulation layer 272 and the inner wall housing 290. As illustrated in FIG. 7A, the fluid path 280 may include a tube 282 surrounding the inner wall housing 290. The present general inventive concept is not limited thereto. As illustrated in FIG. 7B, the tube 282 may have a protrubance 283 toward the inside of the inner wall housing 290. The soak chamber 210, the test chamber 220 and the exit chamber 230 may include a bottom wall 204, a side wall 206, a partition wall 207 and a top wall 208. The fluid path 280 may be extended in the bottom wall 204, the side wall 206, the partition wall 207 and the top wall 208. The partition wall 207 may separate the soak chamber 210 from the test chamber 220 and may separate the test chamber 220 from the exit chamber 230. The outer wall housing 270 may surround the soak chamber 210, the test chamber 220 and the exit chamber 230. The soak chamber 210, the test chamber 220 and the exit chamber 230 may have respective inner wall housings 290. The inner wall housings 290 are adjacent to each other to form the partition wall 207. Thus, the tube 282 may be disposed between the inner wall housings 290 in the partition wall 207.

As illustrated in FIG. 8, the fluid path 280 may be disposed in the inner wall housing 290. For instance, the fluid path 280 may include a hole 284 formed in the inner wall housing 290. The hole 284 formed in the inner wall housing 290 may surround the whole of the soak chamber 210, the test chamber 220 and the exit chamber 230. The fluid path 280 of hole type may be extended in the inner wall housings 290 of the partition wall 207.

Thus, the soak chamber 210, the test chamber 220 and the exit chamber 230 may be heated or cooled by a heat medium or a coolant in the fluid path 280 of the tube 282 or the hole 284.

Figure 9:
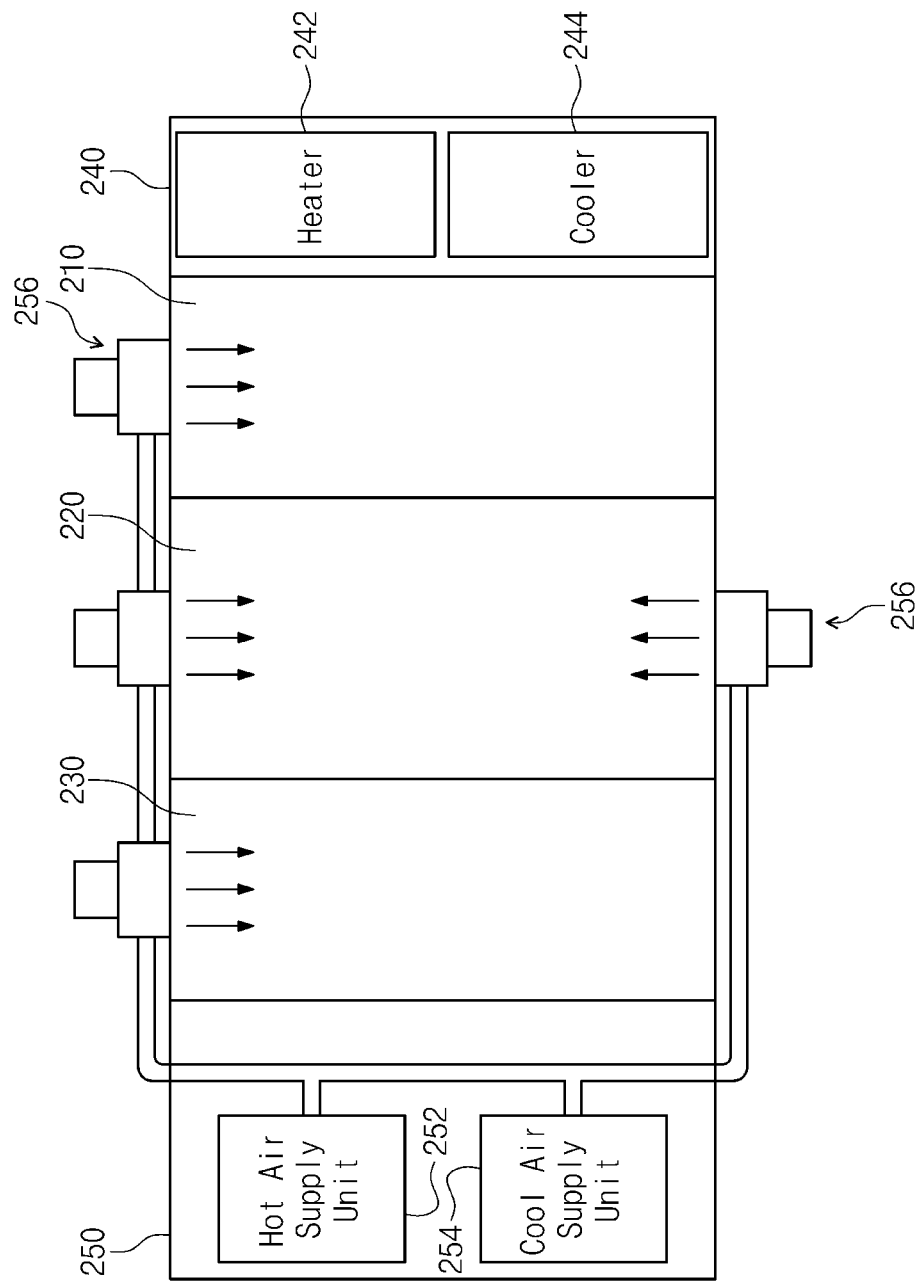
FIG. 9 is illustrates exemplary embodiments of a flow of heated air or cooling air being supplied from an air supply unit to a soak chamber, a test chamber and an exit chamber in accordance with the present general inventive concept.

FIG. 9 illustrates an exemplary embodiment of the flow of heated air or cooling air being supplied from an air supply unit to a soak chamber, a test chamber and an exit chamber.

Referring to FIG. 9, the air supply unit 350 may include a hot air supply unit 252 and a cool air supply unit 254. The hot air supply unit 252 may include a heater. The cool air supply unit 254 may include a liquid nitrogen tank. The liquid nitrogen has a temperature of about negative 196° C. The liquid nitrogen may be sprayed through a nozzle connected to the air blower 256. Thus, the air supply unit 250 may change temperatures of the soak chamber 210, the test chamber 220 and the exit chamber 230 by convection of elevated temperature air and/or reduced temperature air.

Figure 10:
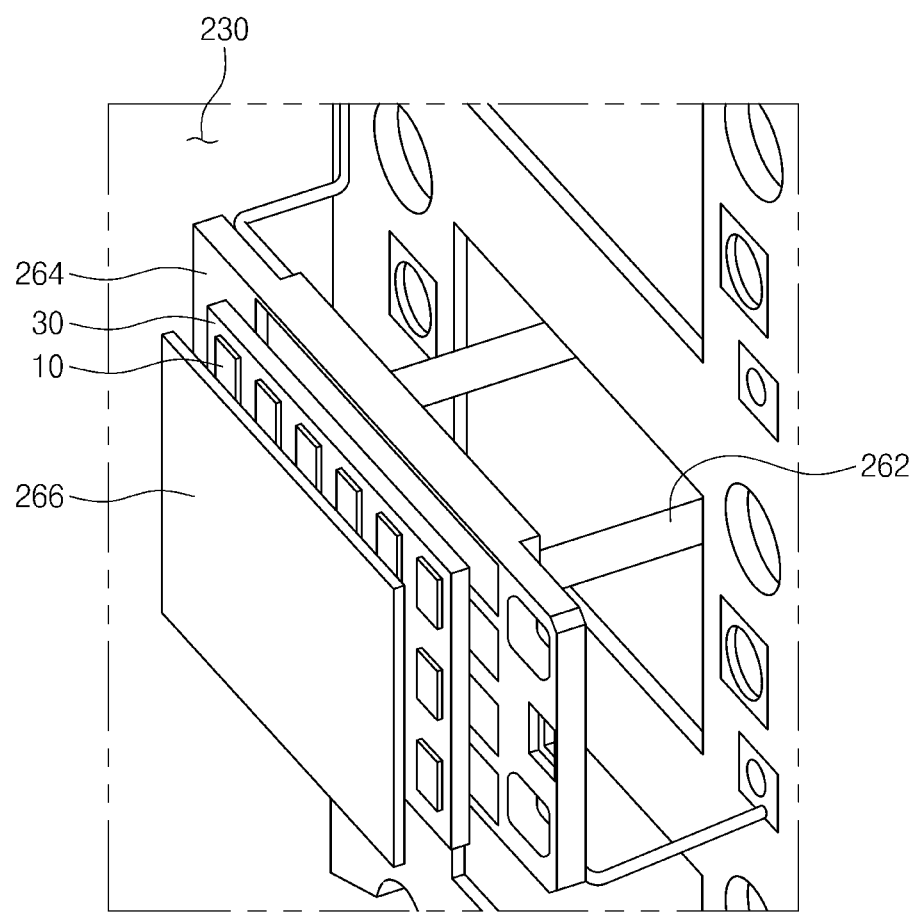
FIG. 10 illustrates exemplary embodiments of a test tray, a test module and a tester in accordance with the present general inventive concept.
Figure 11:
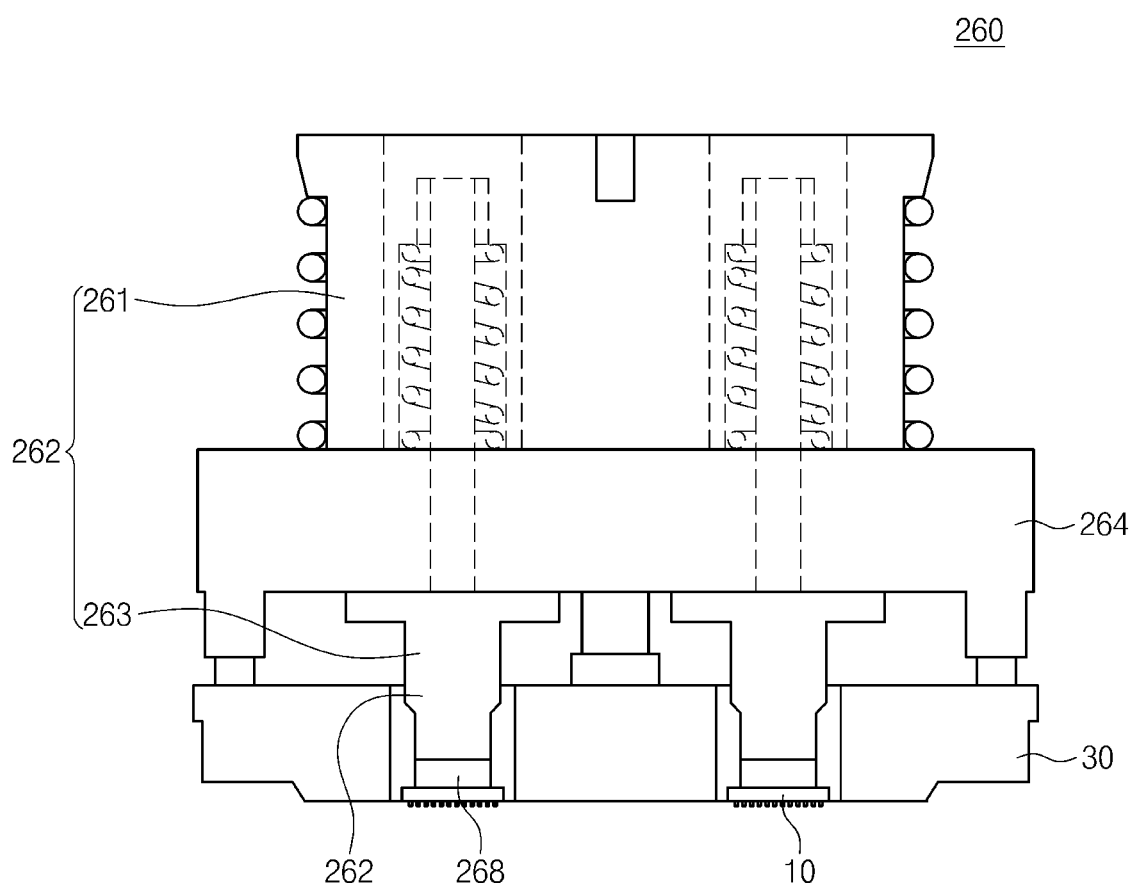
FIG. 11 illustrates an exemplary embodiment of a test module in accordance with the present general inventive concept.

FIG. 10 illustrates an exemplary embodiment of a test tray 30, a test module 260 and a tester 300 in accordance with the present general inventive concept. FIG. 11 illustrates an exemplary embodiment of a test module 260 in accordance with the present general inventive concept.

Referring to FIGS. 6, 10 and 11, the semiconductor devices 10 may be tested while being mounted on the test tray 30. The test tray 30 may be moved in the soak chamber 210, the test chamber 220 and the exit chamber 230 while it stands vertically. The semiconductor devices 10 may be tested in the first test chamber 221 and the second test chamber 222. The test module 260 may be disposed in the first test chamber 221 and the second test chamber 222. The test module 260 may electrically connect the semiconductor devices 10 to tester 300 outside the test handler. The test module 260 may include the load pusher 262, the contact drive plate 264, the test board 266 and a device heat transformer 268.

The load pusher 262 may press the contact drive plate 264, the test tray 30 and the semiconductor devices 10 against the test board 266. The load pusher 262 may include a first load pusher 261 and a second load pusher 263. The first load pusher 261 may be connected to the contact drive plate 264. The second load pusher 263 may fix the device heat transformer 268.

The contact drive plate 264 may press the test tray 30 against the test board 266. The test board may electrically contact the semiconductor devices 10. As illustrated in FIG. 6, the test board 266 may either be affixed to the inner wall of the test chamber 220 or may be located below the inner wall 267. The tester 300 may perform an electrical test of the semiconductor devices 10.

The device heat transformer 268 is combined with an end portion of the load pusher 262. The semiconductor devices 10 may contact the device heat transformer 268. The device heat transformer 268 may include a thermoelectric device or a radiant heat block. The thermoelectric device may be heat-absorbed or heat-generated by a supply voltage being applied from the outside. The radiant heat block may be cooled or heated by coolant or heat medium being supplied from the outside. The device heat transformer 268 may directly heat or cool the semiconductor devices 10. The heat exchanger 240 and the air supply unit 250 may rapidly change air around the semiconductor devices 10 or a temperature of the test chamber 220.

Thus, the handler in accordance with exemplary embodiments of the present general inventive concept may minimize or remove a test waiting time of the semiconductor devices 10. Also, an operation efficiency of the tester 300 may be increased.

A method of testing the semiconductor devices 10 using the test handler in accordance with exemplary embodiments of the present general inventive concept will be described as follows.

Figure 12:
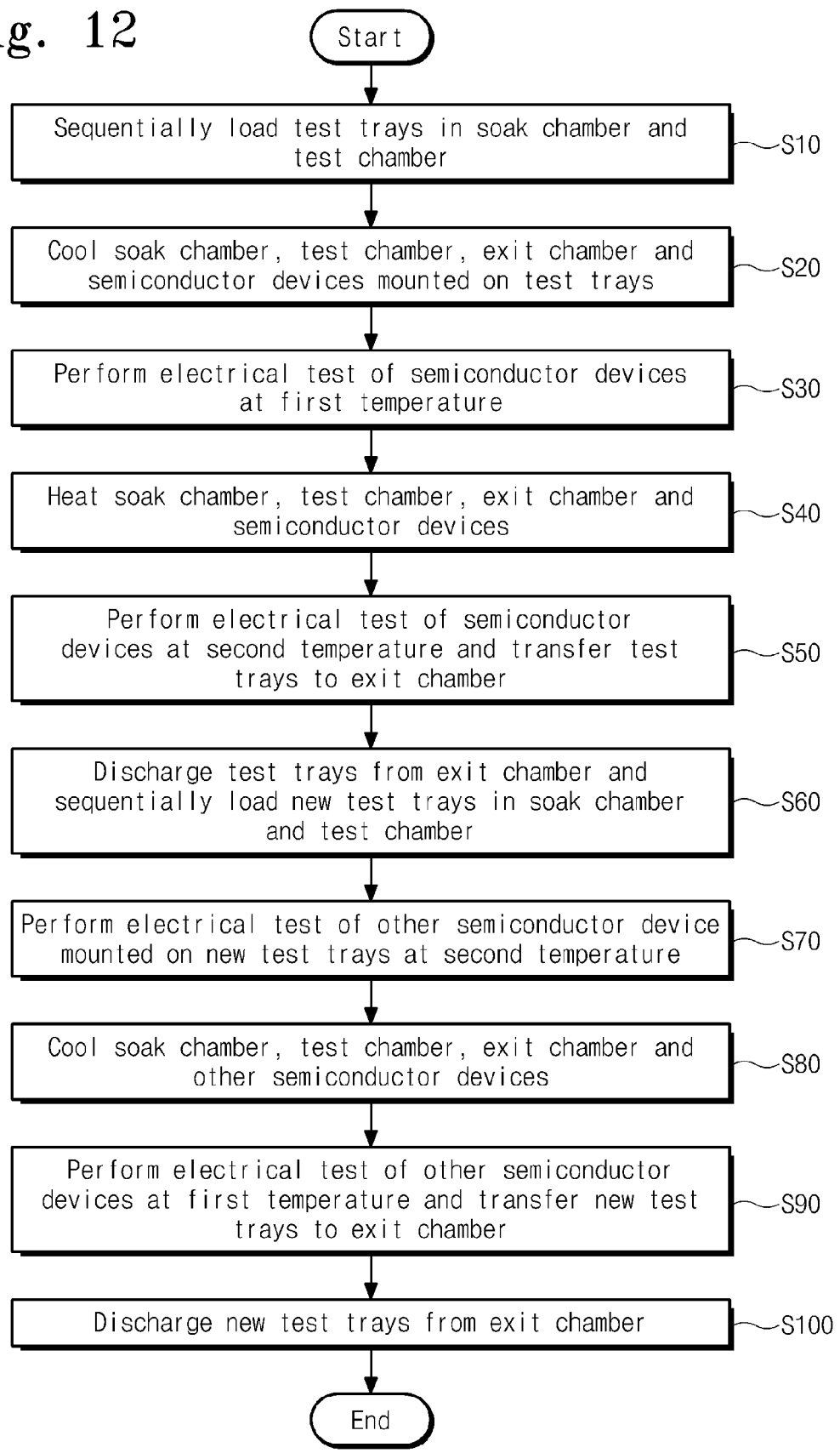
FIG. 12 is a flow chart illustrating a method of testing a semiconductor device using a test handler in accordance with exemplary embodiments of the present general inventive concept.

FIG. 12 is a flow chart illustrating a method of testing a semiconductor device 10 using a test handler in accordance with exemplary embodiments of the present general inventive concept.

Referring to FIGS. 1 through 12, a plurality of test trays 30 is loaded in the soak chamber 210 and the test chamber 220 at operation S10. The test tray 30 may be sequentially supplied from the loader 120 to the soak chamber 210. The test tray 30 may be loaded in the soak chamber 210 at room temperature. The test tray 30 may be transferred from the soak chamber 210 to the test chamber 220. The test module 260 in the test chamber 220 may press the semiconductor devices 10 and the test tray 30 against the test board 266.

The soak chamber 210, the test chamber 220, the exit chamber 230 and the semiconductor devices 10 are cooled to a reduced temperature at operation S20. The cooler 244 may circularly supply coolant to the fluid path 280 of the soak chamber 210, the test chamber 220 and the exit chamber 230. The cool air supply unit 254 may supply cooling air to the insides of the soak chamber 210, the test chamber 220 and the exit chamber 230. The test tray 30 and the semiconductor devices 10 in the soak chamber 210, the test chamber 220 and the exit chamber 230 may be rapidly cooled by coolant and cooling air. The device heat transformer 268 may cool the semiconductor devices 10.

The tester 300 tests the semiconductor devices 10 in the test chamber 220 at a reduced temperature at operation S30. The semiconductor devices 10 may be electrically tested at a reduced temperature of about −25° C.~−5° C.

Then, the soak chamber 210, the test chamber 220, the exit chamber 230 and the semiconductor devices 10 are heated to an elevated temperature at operation S40. The heater 242 of the heat exchanger 240 may circularly supply a heat medium to the fluid path 280 in the wall 202 of the soak chamber 210, the test chamber 220 and the exit chamber 230. The hot air supply unit 252 may supply heated air to the soak chamber 210, the test chamber 220 and the exit chamber 230. The device heat transformer 268 may heat the semiconductor devices. The semiconductor devices 10 may be heated while being electrically connected to the test board 266.

The tester 300 tests the semiconductor devices 10 at an elevated temperature, and then transfers the test tray 30 to the exit chamber 230 at operation S50. The semiconductor devices 10 may be electrically tested at an elevated temperature of about 65° C.~85° C. A test process of the semiconductor device 10 may be finished at a reduced temperature and an elevated temperature. Thus, the test method of the semiconductor devices 10 in accordance with exemplary embodiments of the present general inventive concept may minimize a test waiting time.

If an elevated temperature test process of the semiconductor devices 10 is completed, the test module 260 may separate the test tray 30 and the semiconductor devices 10 from the test board 266. Immediately after separation, the test tray 30 may be transferred to the exit chamber 230.

The test tray 30 on which the semiconductor devices 10 of which test process is completed are mounted is discharged from the exit chamber 230, and new test tray 30 is loaded in the soak chamber 210 and the test chamber 220 at operation S60. The test module 260 may press the other semiconductor devices 10 mounted on the new test tray 30 and the new test tray 30 against the test board 266. At this time, the soak chamber 210 and the test chamber 220 are maintained at an elevated temperature. At least one new test tray 30 may be loaded in the soak chamber 210 before the test process is completed. For example, the new test tray 30 may be loaded in the soak chamber 210 at room temperature while the cooled soak chamber 210 is heated. The test tray 30 may be moved into the test chamber 220 which is at an elevated temperature. The other semiconductor devices 10 may be electrically connected to the test board 266 at an elevated temperature. The other semiconductor devices 10 may be temporarily cooled by the heat exchanger 268 when being connected to the test board 266. The present general inventive concept is not limited thereto but may be variously embodied.

The tester 300 tests the other semiconductor devices 10 mounted on the new test tray 30 at an elevated temperature at operation S70. The other semiconductor devices 10 may be tested at about 65° C.~85° C.

After that, the soak chamber 210, the test chamber 220, the exit chamber 230 and the other semiconductor devices 10 are cooled again at operation S80. The cooler 244 of the heat exchanger 240 may supply coolant to the fluid path 280 in the walls 202 of the soak chamber 210, the test chamber 220 and the exit chamber 230. The cool air supply unit 254 may supply cooling air to the soak chamber 210, the test chamber 220 and the exit chamber 230. The heat exchanger 268 may cool the semiconductor devices 10. The other semiconductor devices 10 may be cooled while being connected to the test board 266.

The tester 300 tests the other semiconductor devices 10 mounted on the new test tray at a reduced temperature, and then transfers the new test tray 30 to the exit chamber 230 at operation S90. A reduced temperature test process may be performed at about −25° C.~−5° C. After the other semiconductor devices 10 are changed from an elevated temperature to a reduced temperature, the test process of the other semiconductor devices 10 is completed. Thus, the other semiconductor devices 10 may be tested at an elevated temperature and at a reduced temperature, respectively.

The test tray 30 is discharged from the exit chamber 230 to the outside at operation S100. When the test tray 30 being loaded in the soak chamber 210 no longer occurs, the test process is completed. In the case that a subsequent test process is performed, a plurality of test trays 30 is sequentially loaded in the soak chamber 210 and the test chamber 220 at operation S10. Then, semiconductor devices 10 mounted on the plurality of test trays 30 may be tested in the test chamber 220 because the soak chamber 210, the test chamber 220 and the exit chamber 230 are cooled in the previous test process.

Thus, the test process of the semiconductor devices 10 may be performed once at an elevated temperature and at a reduced temperature. A reduced temperature test process and an elevated temperature test process with respect to the semiconductor devices 10 mounted on the one test tray 30 may be performed sequentially regardless of the priority. Unlike FIG. 12, the reduced temperature test process at operation S90 after the elevated temperature test process of the semiconductor devices 10 may be performed before the elevated temperature test process at operation S50 after the reduced temperature test process at operation S20 of the semiconductor devices 10. The present general inventive concept is not limited thereto, but may be variously embodied.

According to exemplary embodiments of the present general inventive concept, as illustrated in FIG. 2 and FIG. 10, a test handler, i.e., a test part 200, may include a stocker 110, a loader 120, an unloader 130, a soak chamber 210, a test chamber 220, an exit chamber 230, a heat exchanger 240, an air supply unit 250 and a test module 260. The soak chamber 210, the test chamber 220 and the exit chamber 230 may have a fluid path 280 circulating coolant or heat medium provided from the heat exchanger 240 in the walls. The air supply unit 250 may provide cooling air or heated air to the soak chamber 210, the test chamber 220 and the exit chamber 230. The test module 260 may be disposed in the test chamber 220. The test module 260 may include a load pusher 262, a contact drive plate 264, a test board and a device heat transformer 268. The heat exchanger 240, the air supply unit 250 and the device heat transformer 268 may rapidly change temperatures of the semiconductor devices 10 in the test chamber 220.

Figure 13:
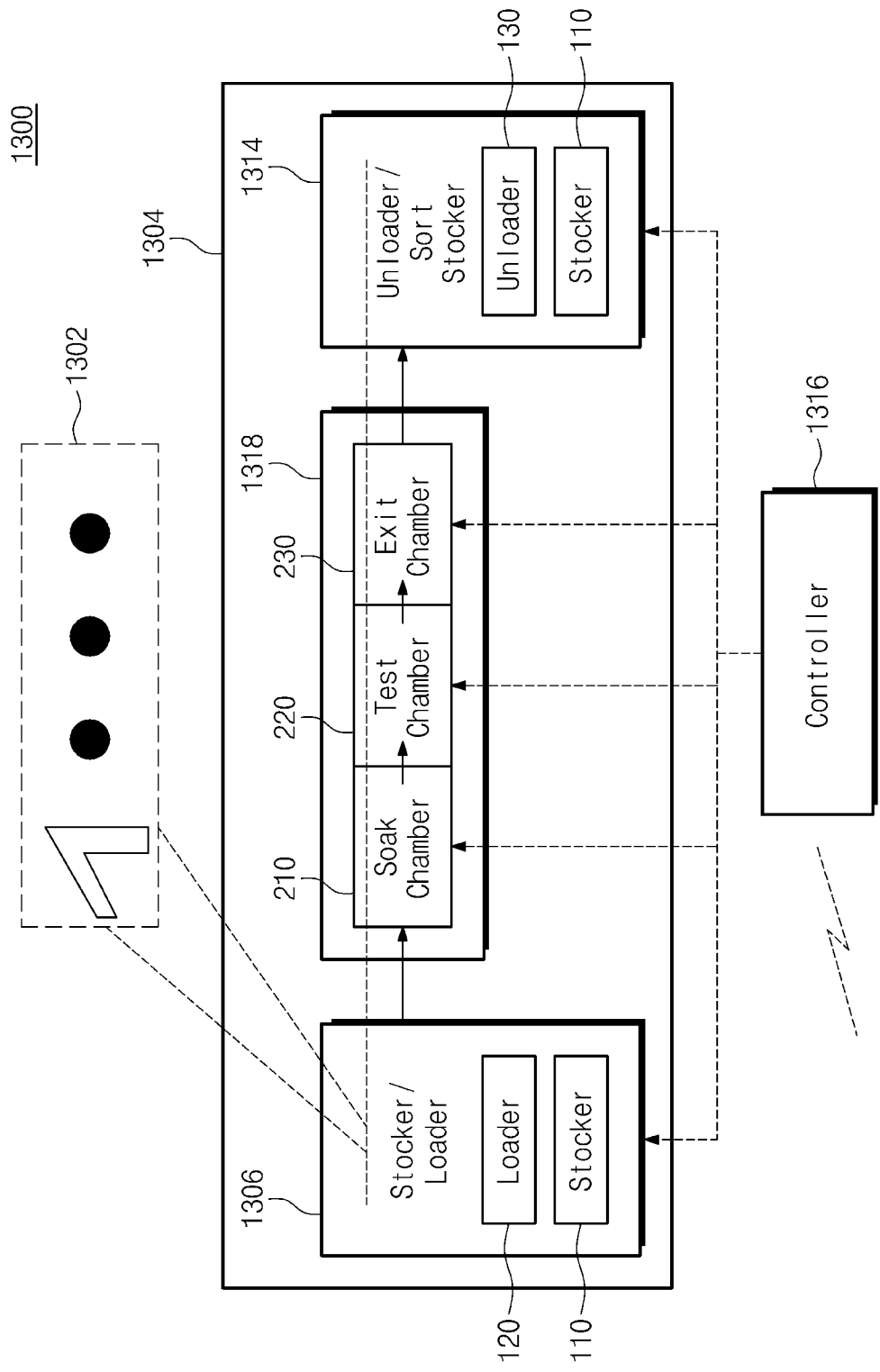
FIG. 13 illustrates a block diagram of exemplary embodiments of the present general inventive concept that provide a semiconductor manufacturing apparatus to carry a test tray from a stocker/loader through a tri-chamber processing unit and an unloader/sort stocker in an internal space that is sealed from the outside.

As illustrated in FIG. 13, exemplary embodiments of the present general inventive concept may provide a semiconductor manufacturing apparatus 1300 to carry the test tray 30 along an enclosed manufacturing path 1304 through an internal space that is sealed from the outside. The test tray 30 advances from a stocker/loader 1306 to a tri-chamber processing unit 1318 having the soak chamber 210, the test chamber 220 and the exit chamber 230, and to an unloader/sort stocker 1314. That is, the stocker/loader 1306 has the loader 120 and the stocker 110, and the unloader/sort stocker 1314 has the unloader 130 and the stocker 110. The soak chamber 210 pre-heats or pre-cools the semiconductor devices 10 before performing a test. The test tray 30 may be vertically inserted into a door of the soak chamber 210 from the stocker/loader 1306. Alternatively, where selected, at least one robot arm or an elevator 1302 may be disposed in the stocker/loader 1306, the soak chamber 210, the test chamber 220, the exit chamber 230, and the unloader/sort stocker 1314. The at least one robot arm or elevator 1302 may move the test tray 30 from the soak chamber 210 to the exit chamber 230 while maintaining a vertical state. The test chamber 220 may be connected to the soak chamber 210.

The robot arm or the elevator 1302 may move the test tray 30 from the soak chamber 210 to the test chamber 220. The semiconductor devices 10 may be tested by the test module 260 in the test chamber 220 as described in detail above in FIG. 11. The test chamber 220 may be connected to the exit chamber 230. The test tray 30 may be moved from the test chamber 220 to the exit chamber 230 by the at least one robot arm or elevator 1302. The exit chamber 230 may minimize a temperature change of the test chamber 220. A controller 1316 may control movement of the test tray 30 through the stocker/loader 1306, the soak chamber 210, the test chamber 220, the exit chamber 230, and the unloader/sort stocker 1314 as generally described above. The controller 1316 may be operated manually via a user interface, automatically by one or more control programs, or remotely by wireless or wired communication.

Figure 14:
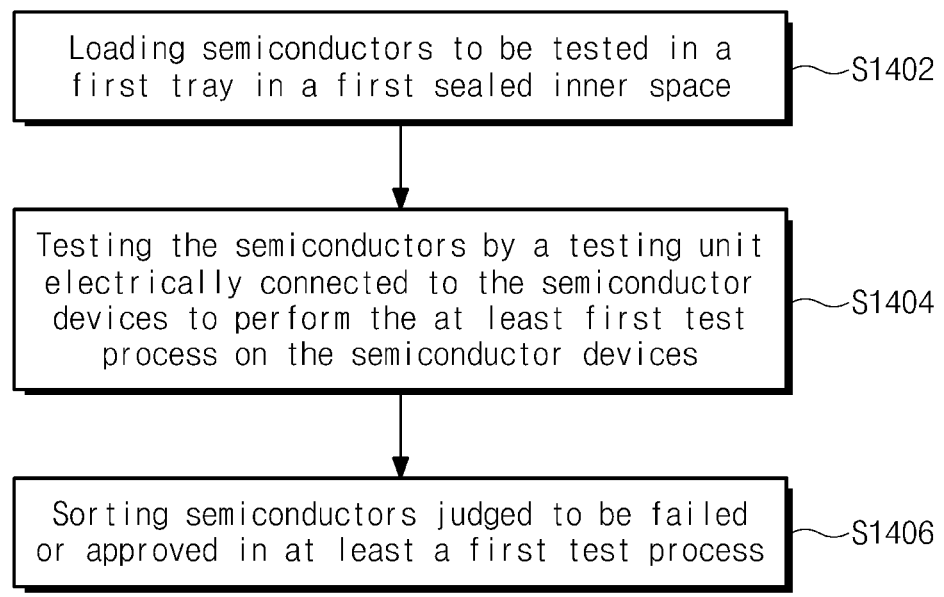
FIG. 14 is a flow chart illustrating another method of testing a semiconductor device in accordance with exemplary embodiments of the present general inventive concept.

FIG. 14 is a flow chart illustrating another method of testing a semiconductor device in accordance with exemplary embodiments of the present general inventive concept. The method may include loading semiconductors to be tested in a first tray in a first sealed inner space at operation S1402, testing the semiconductors by a testing unit electrically connected to the semiconductor devices to perform the at least first test process on the semiconductor devices at operation S1404, and sorting semiconductors determined to be failed or approved in at least a first test process at operation S1406, wherein the testing unit has a fluid path circulating coolant or a heat medium in walls thereof so that a temperature of at least a portion of the testing unit is changed efficiently in the test process of the semiconductor devices so as to provide at least one of a first temperature that is less than room temperature and a second temperature that is greater than room temperature.

Testing the semiconductors by a testing may include pre-heating or pre-cooling the semiconductor devices before performing the at least first test process, performing the at least first test process on the semiconductor devices, and transferring the semiconductors through an exit chamber.

Therefore, the test handler in accordance with exemplary embodiments of the present general inventive concept may minimize or remove a test waiting time of the semiconductor devices.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A test handler comprising:
    a plurality of chambers to provide a sealed inner space accommodating a first tray on which semiconductor devices are mounted;
    a test module electrically connected to the semiconductor devices in the plurality of chambers to perform a test process of the semiconductor devices; and
    a sort part to load and unload the first tray in the plurality of chambers and to sort semiconductor devices determined to be failed at the test process,
    wherein the plurality of chambers have a fluid path circulating coolant or a heat medium in walls thereof so that a temperature of the plurality of chambers is changed at the test process of the semiconductor devices between a first temperature that is less than room temperature and a second temperature that is greater than room temperature, and wherein the fluid path is disposed in an inside of the respective walls defining the corresponding chambers to surround the corresponding chambers such that the coolant or the heat medium flows along the walls of the corresponding chambers.

2. The test handler of claim 1, wherein each wall of the plurality of chambers comprises:
    an outer housing;
    an inner housing in the outer housing; and
    an insulating layer between the outer housing and the inner housing.

3. The test handler of claim 2, wherein the fluid path is disposed between the insulating layer and the inner housing.

4. The test handler of claim 3, wherein the fluid path comprises a tube surrounding the inner housing.

5. The test handler of claim 2, wherein the fluid path comprises a hole formed in the inner housing.

6. The test handler of claim 1, wherein each of the plurality of chambers comprises a bottom wall, a partition wall and a top wall,
    wherein the fluid path is extended in the bottom wall, the partition wall and the top wall.

7. The test handler of claim 1, further comprising a heat exchanger to circularly supply the coolant or the heat medium to the fluid path of the wall of the plurality of chambers.

8. The test handler of claim 7, wherein the heat exchanger comprises:
    a cooler to circularly supply the coolant to the fluid path; and
    a heater to circularly supply the heat medium to the fluid path.

9. The test handler of claim 1, wherein the plurality of chambers comprises a soak chamber, a test chamber and an exit chamber.

10. The test handler of claim 9, wherein the test module comprises:
    a test board in the test chamber;
    a load pusher to press the semiconductor devices against the test board;
    a contact drive plate to be pushed by the load pusher so as to press the first tray against the test board; and
    a device heat transformer connected to end portions of the load pusher to contact the semiconductor devices, the device heat transformer to heat or to cool the semiconductor devices.

11. The test handler of claim 1, further comprising an air supply unit comprising:
    a cool air supply unit to supply cooling air of the first temperature to the plurality of chambers; and
    a heated air supply unit to supply heated air of the second temperature to the plurality of chambers.

12. The test handler of claim 1, wherein the sort part comprises:
    a stocker having a second tray on which a plurality of semiconductor devices is mounted;
    a loader to transfer the second tray from the stocker and to mount the semiconductor devices of the second tray on the first tray; and
    an unloader to unload the first tray from the chambers, to mount the semiconductor devices of the first tray on the second tray again and to transfer the second tray to the stocker.

13. A test handler comprising:
    a stocker/loader to provide at least a first sealed inner space to load semiconductor devices;
    a tri-chamber processing unit to perform at least a first test process on the semiconductor devices when electrically connected to the semiconductor devices;
    an unloader/sort stocker to unload semiconductor devices and to sort semiconductor devices determined to be failed or approved in the at least first test process; and
    a controller to control a transfer of the semiconductor devices along a semiconductor manufacturing apparatus,
    wherein the tri-chamber processing unit has a fluid path circulating coolant or a heat medium in walls thereof so that a temperature of at least a portion of the tri-chamber processing unit is changed rapidly at the test process of the semiconductor devices so as to provide at least one of a first temperature that is less than room temperature and a second temperature that is greater than room temperature, and wherein the fluid path is disposed in an inside of the respective walls defining the tri-chamber processing unit to surround the tri-chamber processing unit such that the coolant or the heat medium flows along the walls of the tri-chamber processing unit.

14. The test handler of claim 13, wherein the stocker/loader comprises a stocker to load a plurality of semiconductor devices to a first tray and a loader to load semiconductor devices from the plurality of semiconductor devices mounted in the first tray into a second tray and to advance the second tray along the semiconductor manufacturing apparatus to a soak chamber.

15. The test handler of claim 14, wherein the unloader/sort stocker includes an unloader to advance the second tray along the semiconductor manufacturing apparatus from an exit chamber and to unload semiconductors mounted in the second tray.

16. The test handler of claim 15, wherein the unloader/sort stocker includes a sort part to sort semiconductors in accordance with whether the semiconductors are determined to be failed or approved in the at least first test process.

17. The test handler of claim 13, wherein the tri-chamber processing unit comprises a plurality of chambers that include:
   a soak chamber to pre-heat or pre-cool the semiconductor devices before performing the at least first test process;
   a test chamber to perform an electrical test on the semiconductor devices; and
   an exit chamber to minimize temperature change of the test chamber during transfer of the semiconductor devices from the test chamber to the exit chamber.

* * * * *